United States Patent [19]

Ishimoto

[11] Patent Number: 4,633,441
[45] Date of Patent: Dec. 30, 1986

[54] DUAL PORT MEMORY CIRCUIT

[75] Inventor: Shoji Ishimoto, Tokyo, Japan

[73] Assignee: NEC, Tokyo, Japan

[21] Appl. No.: 655,497

[22] Filed: Sep. 28, 1984

[30] Foreign Application Priority Data

Sep. 29, 1983 [JP] Japan .................................. 58-181092

[51] Int. Cl.[4] ............................................. G11C 13/00
[52] U.S. Cl. .................................. 365/189; 365/219; 365/220; 365/230
[58] Field of Search ............... 365/219, 220, 221, 230, 365/238, 236, 189

[56] References Cited

U.S. PATENT DOCUMENTS 4,106,109  8/1978  Fassbender .......................... 365/221
4,402,067  8/1983  Moss et al. .......................... 365/219

Primary Examiner—Terrell W. Fears
Attorney, Agent, or Firm—Sughrue, Mion, Zinn Macpeak & Seas

[57] ABSTRACT

Dual port memory which enables consecutive access operations from an arbitrary address. The memory includes a memory array, a random access peripheral circuit for effecting random access to the array, a counter, a setting circuit for setting the counting state of the counter at an optional value, a selection circuit for consecutively selecting the array in response to the output of the counter, and a control circuit for advancing the state of the counter in response to a shift pulse.

16 Claims, 10 Drawing Figures

DUAL PORT MEMORY CIRCUIT

BACKGROUND OF THE INVENTION

The present invention relates to a memory circuit and more particularly to a dual port memory circuit.

Random access memories (RAMs) utilizing the LSI technique have been used mainly as the main memories of computers and have come into widespread use in office automation devices, such as personal computers. Due to the remarkable reduction in the cost per bit of storage, MOS random access memories are used for processing video images, especially for displaying images on a CRT. A memory device used with such a display is connected between a CPU and the CRT. The CPU communicates with the RAM on a random access basis and supplies the display information to the RAM. The memory access time depends upon the speed of the CPU. Data transfer from the memory to the CRT is performed on a line-by-line sequential basis rather than on a random access basis. Moreover, the speed of such data transfer depends upon the display size of the CRT. Namely, the speed is determined in dependence upon the required resolution of the CRT. At present, the display size of a CRT frequently used in personal computers of 8-bit type is 640×400 dots (=256,000 dots) in one frame, and a cycle time of about 45 NS is required per dot.

The RAM for data display will hereinafter be referred to as a "VRAM". At present, such devices are inefficient for display applications. During the display period of the CRT, the data is sent to the CRT continuously at the data rate of 45 NS. During this period, the RAM cannot exchange data with the CPU so that the CPU can neither rewrite nor read the content of the VRAM. The data exchange between the VRAM and the CPU is limited to the blanking period during which no image is displayed on the CRT. As a result, the CPU and the system efficiency is remarkably low.

It has been proposed that RAMs having an input/output system for a CPU and an output system for a CRT are the best suitable for use as a VRAM. Such RAMs are called a "dual port memory".

A known dual port memory is structured such that a shift register is provided to the known RAM and a serial read operation to the CRT is performed via the shift register while performing the usual random access operation by the commonly provided input/output port of the RAM. However, according to such dual port memory, the order of serial read operations through the shift register is fixed. Namely, the serial read operation is always started from the first bit of the shift register, which first bit is located at the bit position closest to the output terminal and advanced towards the final bit of the shift register, which final bit is located at the bit position farthest from the output terminal. Therefore, in the latter dual port memory, it is impossible to start the serial read operation from an optional bit location of the shift register and to end it at another bit location of the shift register. This problem restricts the flexibility in displaying data on the CRT.

SUMMARY OF THE INVENTION

It is an object of the present invention to provide an improved dual port memory wherein the serial read operation can be started from an arbitrary bit location.

It is another object of the present invention to provide an improved dual port memory from which output data can be extracted continuously without any interval time.

The dual port memory according to the present invention is of the type having a memory cell array arranged in rows and columns, a random access peripheral circuit for performing random access operation with respect to the memory cell array in response to row and column address information, and a serial access peripheral circuit for serially accessing the columns of the array in response to shift clocks. The above serial peripheral circuit includes a counter circuit, the output of which is used to select the column of the array, an initial set circuit for determining the initial counting state of the counter, and a shift circuit for advancing the state of the counter in response to the shift clocks.

According to the present invention, the initial state of the counter is adapted to be set at an arbitrary value and hence the starting address of the serial access operation can be optionally determined. In other words, the serial access operation can be started from an arbitrary column address and ended at the column address next to the arbitrary column address. This feature enhances the display flexibility and contributes to the improvement of the VIDEO system.

DETAILED DESCRIPTION OF THE INVENTION

Figure 1:
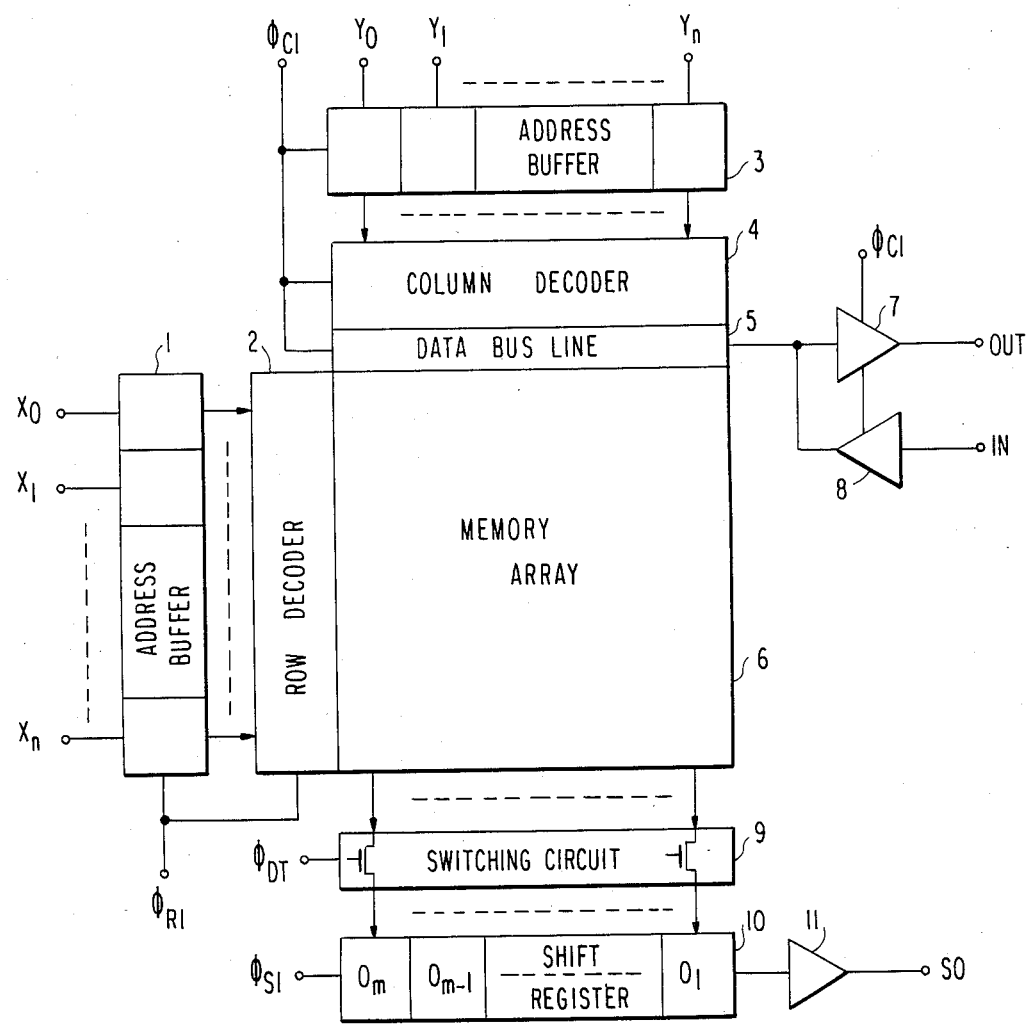
FIG. 1 is a block diagram showing the dual port memory circuit of the prior art.

The prior art dual port memory will be explained with reference to FIG. 1. A row address buffer 1 receives row address inputs $X_0$, $X_1$, - - -, and $X_n$, and a row decoder 2 selects a word line of a memory cell array 6 in response to the outputs of the buffer 1 under control of a control signal $\phi_{R1}$. A column address buffer 3 receives column address inputs $Y_0$, $Y_1$, - - -, and $Y_n$, and a column decoder 4 connects a selected bit line with a data bus line 5. An output buffer 7 is adapted to be controlled by a control signal $\phi_{C1}$ to extract the data of the data bus line as an output OUT. An input buffer 8 is used for writing an input data IN to the data bus line 5 when a write operation is performed. The components described above are common with those of an ordinary RAM and will be called a "RAM unit" in the following explanation.

A shift register 10 is composed of a plurality of bit locations $O_1$ to $O_m$, each associated with a corresponding one of the m bit lines of the cell array 6. A switching circuit 9 is interposed between the bit lines or columns and the bit locations $O_1$ to $O_m$ of the shift register 10.

The transfer of data to the register 10 is conducted as follows. One of the word lines of the cell array 6 is selected by the address circuitry. Sense amplifiers (not shown) begin amplifying the read-out signals on the respective digit lines which carry the bits of the selected word line. Upon completion of the sensing operation, the levels of the bit lines are at a low or high level. Next, the switching circuit 9 is energized to transfer the data of the respective bit lines to the register 10. A sequential output SO can be obtained through a serial output buffer 11 in response to a shift control signal $\phi_{S1}$. For ease of explanation, the register 10 and the buffer 11 are referred to herein as a "serial unit".

As a result of the above operation, in the dual port RAM, the RAM unit and the serial unit can operate independently except for the period of data transfer (which period will be called a "data transfer cycle") from the bit lines to the register of the serial unit. The independent operation is suitable for a VRAM, but there is a problem in that the output sequence of the serial unit has no flexibility. The shift register 10 of the serial unit outputs the data from one end $O_1$ of the shift register, and the read-out operation cannot be started other than from the bit location $O_1$. The latter problem restricts the display method of the CRT. A scrolling function exists as one of the display techniques of a CRT. The scrolling function uses only a portion of the memory area of the VRAM for an actual display, which memory area is designed to be larger than the display size of the CRT as the display data thereby to display its portion. For this function, the output of the serial unit has to be started from an arbitrary address, i.e., bit location, after the data transfer to the register 10. Another problem is that the serial outputs have to come out continuously at the dot rate of the CRT for the period other than the blanking period so that there should be neither a blank period in the output waveform nor a delay in the access time in the cycle of the data transfer from the RAM unit to the serial unit.

Figure 2:
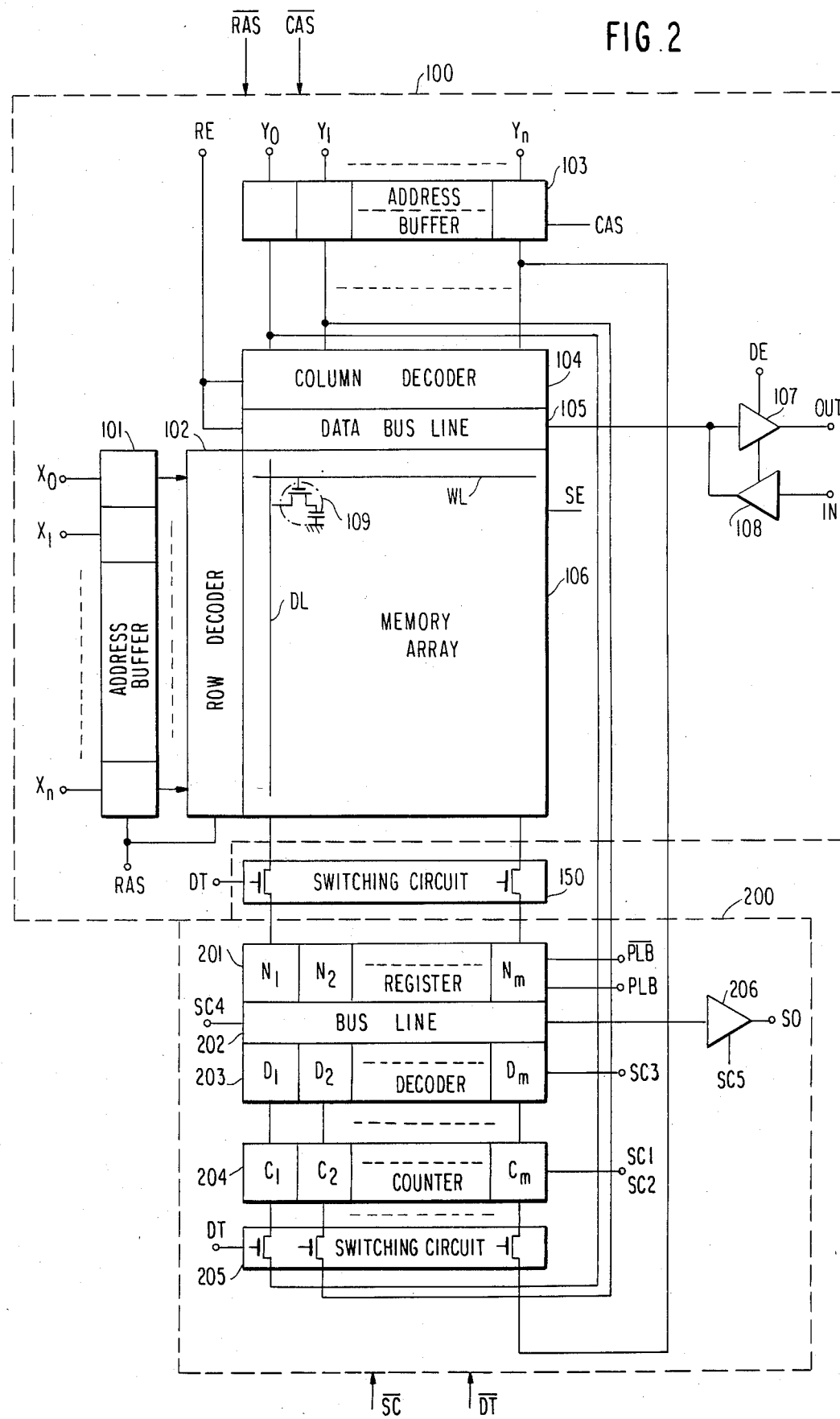
FIG. 2 is a block diagram showing the dual port memory circuit of the present invention.

A basic structure of the present invention is illustrated in FIG. 2.

A RAM unit 100 is identical to the ordinary RAM, such as shown in FIG. 1. By the actions of a row address buffer 101 and a row decoder 102, an arbitrary word line WL of a cell array 106 is selected in accordance with the levels of the row address inputs $X_0$, $X_1$, - - - , and $X_n$. After the selection of the predetermined word line WL, there is established on digit lines DL intersecting the selected word line voltage differences which correspond to the stored levels of cells 109 and such voltage differences are amplified to the low or high level by the conventional sensing operation. The selection of the column lines are conducted similarly, under control of a column address buffer 103 and a column decoder 104. In accordance with the column decoder output, the selected bit line is connected with an I/O bus line 105 so that the individual functions are executed by an input buffer 108 for a write operation and an output buffer 107 for a read operation.

A serial unit 200 is constructed of a register 201 as a temporary memory, a serial address selecting counter 204, a serial decoder 203 for selecting one register in response to the output of counter 204, a lead bus line 202 from which a logic level stored in the register 201 is to be read out, and an output buffer 206. The output from the column address buffer 103 is connected through switching circuit 205 to the counter 204 so as to initialize the counter.

In this case, the register 201 is an m-bit register having memory units $N_1$, $N_2$, - - - , and $N_m$ in correspondence with the m digit lines or columns DL. The decoder 203 has m decoding units $D_1$ to $D_m$, each corresponding to an associated one of the memory units $N_1$ to $N_m$. The counter 204 is an n-bit counter having stages $C_1$ to $C_n$ and is capable of counting from 0 to $2^n$, where $2^n \geq m$.

A switching circuit 150 is composed of "n" FET switches and operates to transfer the data on the digit lines to the register 201 in response to an active level of a control signal DT. Similarly, the switching circuit 205 transfers column address signals from the buffer 103 to the counter 204 in response to the active level of the signal DT, thereby to set the initial counting state of the counter 204. The counting state of the counter 204 is advanced one by one in synchronism with a system clock $\overline{SC}$.

In the memory as illustrated, the known multi-strobe addressing technique is employed wherein the row address inputs and the column address inputs are incorporated through the same set of address terminals in response to a row address strobe signal $\overline{RAS}$ and a column address strobe signal $\overline{CAS}$, respectively. A transfer control signal $\overline{DT}$ is the signal for rewriting the contents of the register 201, and the system clock signal $\overline{SC}$ is used to control the serial unit 200, especially the serial read-out operation thereof.

Figure 3:
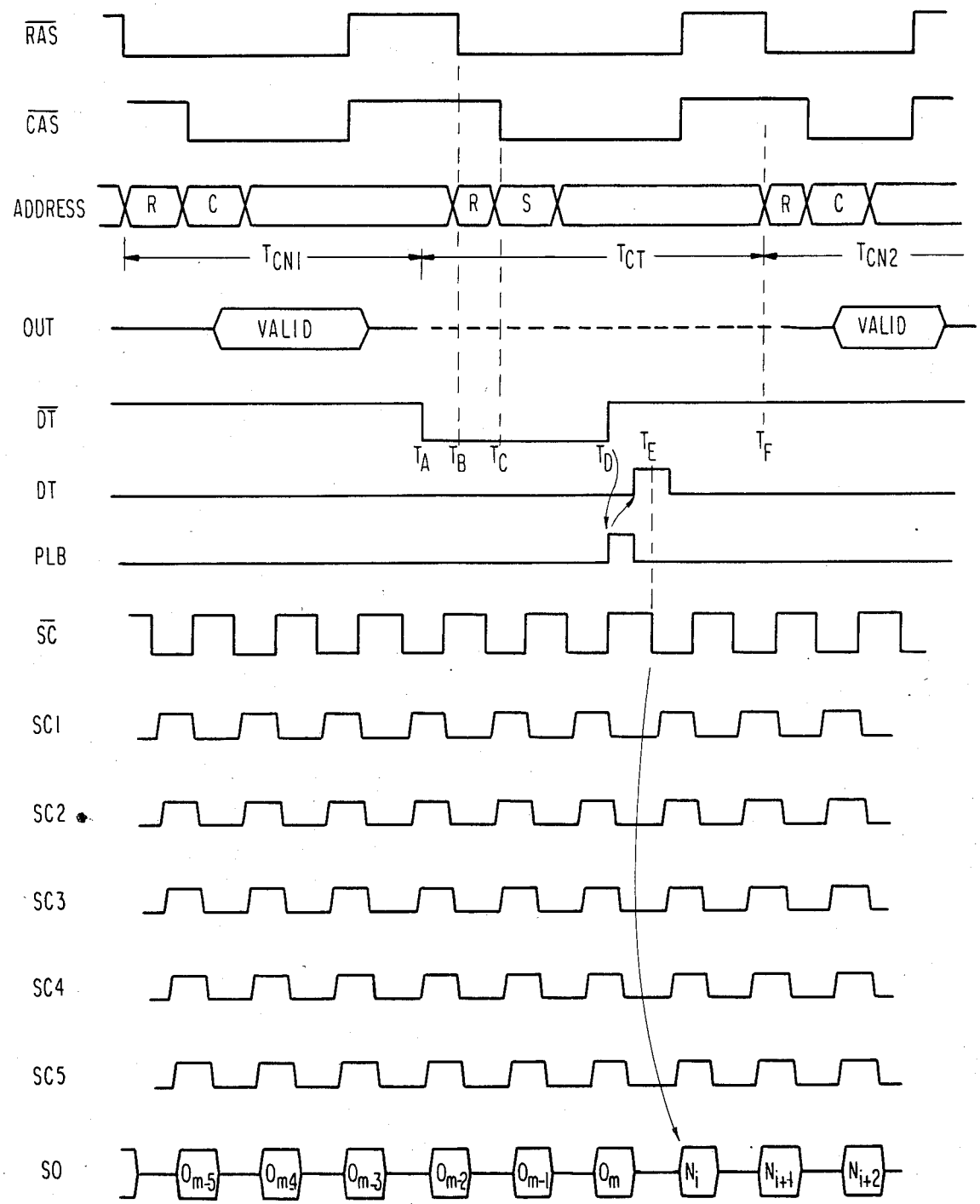
FIG. 3 is a timing chart showing the fundamental operations of the circuit of FIG. 2.

With reference to FIG. 3, operations of the memory of FIG. 2 will be explained. As a starting point in the explanation it will be assumed that the register 201 was previously loaded with data that is being serially read out, the last bit to be read out being the one initially set in the stage $O_m$ (as shown in FIG. 1).

Before a time point $T_A$, the signal $\overline{DT}$ is kept at a high level (inactive level) and the RAM unit 100 performs a normal random access operation for a period TCN1. Namely, the row address R and the column address C are incorporated in response to the low levels of $\overline{RAS}$ and $\overline{CAS}$, respectively, and a read or write operation is carried out conventionally via buffers 107 and 108 and bus line 105. Also, during this period TCN1, the data previously stored in register 201 is sequentially read out in response to the low level of system clocks $\overline{SC}$. Namely, in response to the low level of $\overline{SC}$, signals SC1 to SC5 are generated which control, respectively, the counter 204, decoder 203, bus line 202 and the buffer 206 as illustrated in FIG. 2. The output state of the decoder 203 is advanced one by one in response to $\overline{SC}$ so that the units of the register 201 corresponding to the output of the decoder 203 generate the data to the bus line 202.

At the time point $T_A$, the signal $\overline{DT}$ changes from the high level to the low level (active level) to begin the transfer operation. The signals $\overline{RAS}$ and $\overline{CAS}$ become active (low) levels at time points $T_B$ and $T_C$, respectively, to incorporate the row and column addresses R and C. When $\overline{DT}$ goes to the low level, the operation for renewing the contents of the register 201 begins. Namely, the data transfer cycle period $T_{CT}$ is introduced. During this time, it is not required that the data OUT from the RAM unit 100 is generated.

At time $T_B$, $\overline{RAS}$ becomes active and the memory cells coupled to the word line designated by the row address R are subjected to the conventional refresh operation, which is the same as that in the normal cycle period TCN1, so that the data signals to be transferred appear on the respective digit lines. In this case, the column address C set by $\overline{CAS}$ is intended to be used only for setting the initial state of the counter 204 as will be explained in the following.

Meanwhile the serial unit 200 continues the serial read operations as illustrated by $O_{m-2}$, $O_{m-1}$ and $O_m$ in response to the low level of the signal $\overline{SC}$ and completes the read-out by a time point $T_D$, at which the signal $\overline{DT}$ changes to the high level. It will be appreciated that the control signal $\overline{DT}$ and the system clock $\overline{SC}$ are synchronized externally of the circuit illustrated so as to occur at the time relation shown.

Up to time point $T_D$, the switching circuits 150 and 205 are in the inactive state. At time $T_D$, in response to the change of $\overline{DT}$ to the high level, a precharge signal PLB for the register 201 is made active and resets the register 201. That is, the register 201 is precharged and made ready for receiving new data from the digit lines. Then in response to the high level of the signal PLB, the signal DT becomes high and enables switching circuits 150 and 205. Consequently, the column address C is transferred to the counter 204 to set the initial state thereof while the read-out signals on the digit lines are written into the memory units $N_1$ to $N_m$ of the register 201.

The above operations, carried out in response to the signals PLB and DT, are completed by the next low level of $\overline{SC}$ at a time point $T_E$. In response to the low level of $\overline{SC}$ at time $T_E$, the serial unit outputs the data $N_i$, which is designated by the initial contents of the counter 204 set by the column address C at $T_C$. Thus, the data transfer cycle period $T_{CT}$ ends at a time point $T_F$ at which $\overline{RAS}$ becomes active to introduce the normal cycle period $T_{CN2}$. After the time point $T_E$, the serial unit 200 continues the serial read-out operation by advancing the counting state of the counter 204 in response to the signal $\overline{SC}$ so that the subsequent outputs $N_{i+1}$, $N_{i+2}$, etc., are provided as illustrated in FIG. 3.

In the memory, as explained above, the following two operations are conducted for a time period from the rise point of $T_D$ to the point $T_E$ of $\overline{SC}$:
(1) data transfer circuit 150 is turned on to write the data of the digit lines DL to the registers 201; and
(2) switching circuit 205 is turned on to set the output data of the column address buffer 103 to the counter 204.

By completing those two operations before the fall of $\overline{SC}$, the continuity of the output data can be held without any delay in the speed at which the first bit $N_i$ is read out immediately after $O_m$.

After the data transfer cycle period $T_{CT}$, the RAM unit and the serial unit operate independently. With reference to FIGS. 4 to 7, detailed structures of parts of the memory of FIG. 2 will be explained.

Figure 4:
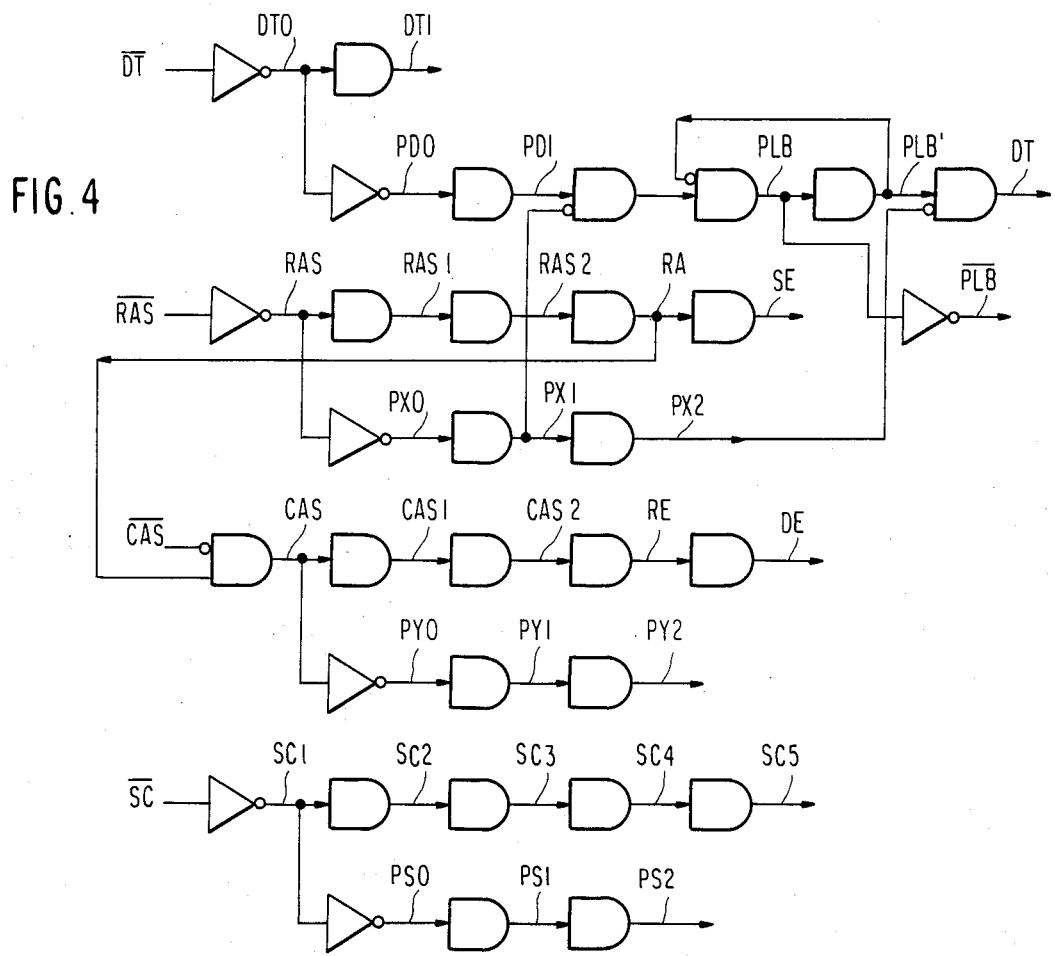
FIG. 4 is a block diagram showing an example of the timing generator used for the present invention.

FIG. 4 shows a timing signal generator employed in the embodiment of FIG. 2. The timing signal generator receives the signals $\overline{DT}$, $\overline{RAS}$, $\overline{CAS}$ and $\overline{SC}$ and generates timing signals such as DT, PLB, SC1 to SC5 for controlling operations of the respective blocks. The circuit comprises conventional gates and inverters as shown. It will be appreciated that a gate having only a single input does provide a small delay between input and output.

Figure 5:
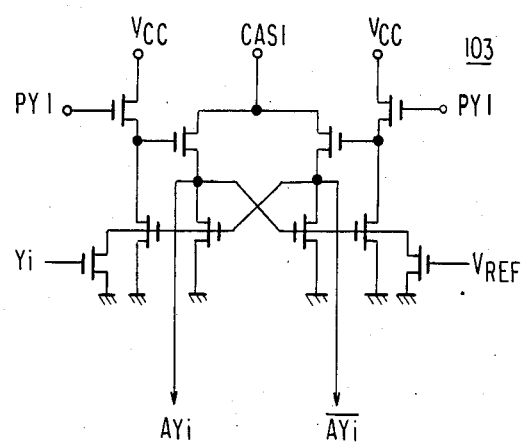
FIG. 5 shows a detailed example of the address buffer employed in the memory of FIG. 2.
Figure 6:
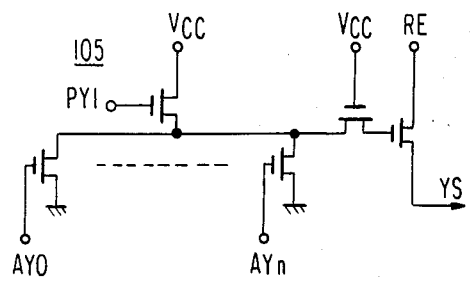
FIG. 6 shows a detailed example of the address decoder employed in the memory of FIG. 2.

FIG. 5 shows a single stage of the column address buffer 103, and FIG. 6 shows a single stage of the column decoder 105, which is driven by the outputs of the column address buffer 103. In the drawings, reference $Y_i$ indicates one of the column address inputs and Vref indicates a reference voltage which is set at about 1.5 V for a power voltage of 5 V as $V_{cc}$.

Figure 7A:
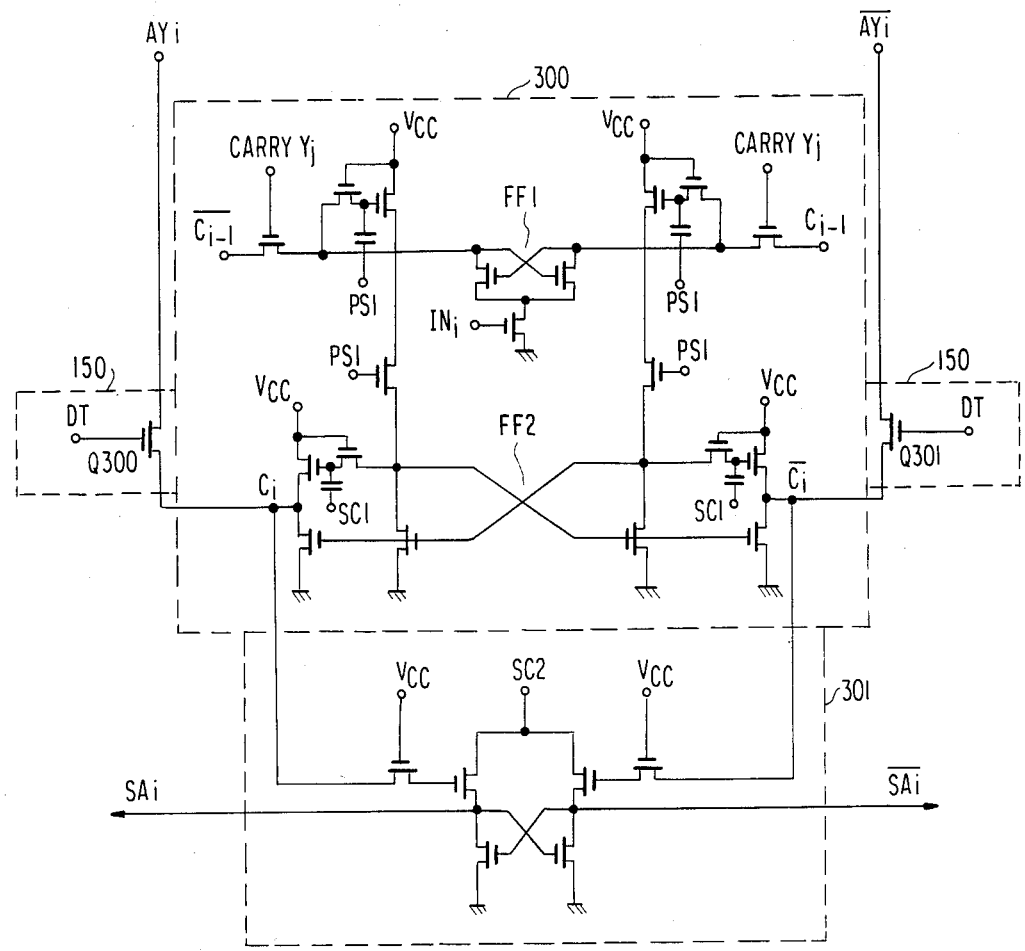
FIGS. 7a, 7b and 7c, show a detailed example of the counter employed in the memory of FIG. 2.
Figure 7B:
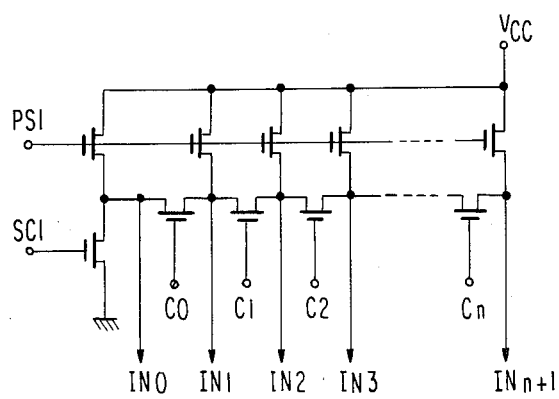
Figure 7C:
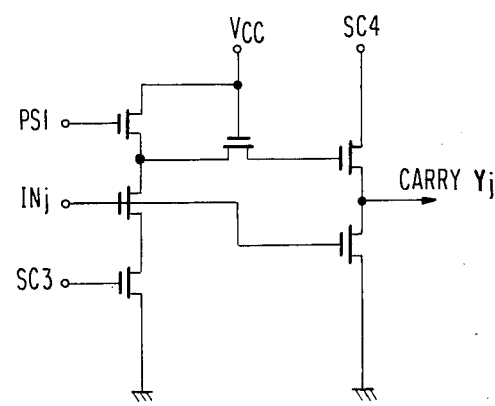

FIGS. 7(a)–7(c) show the detailed structure of the counter 204.

A single stage of the counter 204 is illustrated in FIG. 7(a), which is composed of a binary counter section 300 and a buffer section 301. The counter section 300 is basically composed of a flip-flop FF1 to which count outputs $C_{i-1}$ and $\overline{C}_{i-1}$ from the next lower counting stage are applied and a flip-flop for holding the counting outputs $C_i$ and $\overline{C}_i$ of the latter stage. True and complement column address signals $AY_i$ and $\overline{AY}_i$ are applied to the flip-flop FF2 from the buffer 103 via FETs $Q_{300}$ and $Q_{301}$, forming the switching circuit 150. The buffer section 301 has a flip-flop structure and, in response to SC2, generates true and complement counting outputs $SA_i$ and $\overline{SA}_i$, which are applied to the decoder 203.

FIG. 7(b) shows an increment signal generator for generating increment signals $IN_0$ to $IN_{n+1}$, and FIG. 7(c) shows a carry signal generator for generating a carry signal CARRY $Y_j$. Both the increment signals and carry signals are used for controlling operation of the counter section 300 in a known manner.

Figure 8:
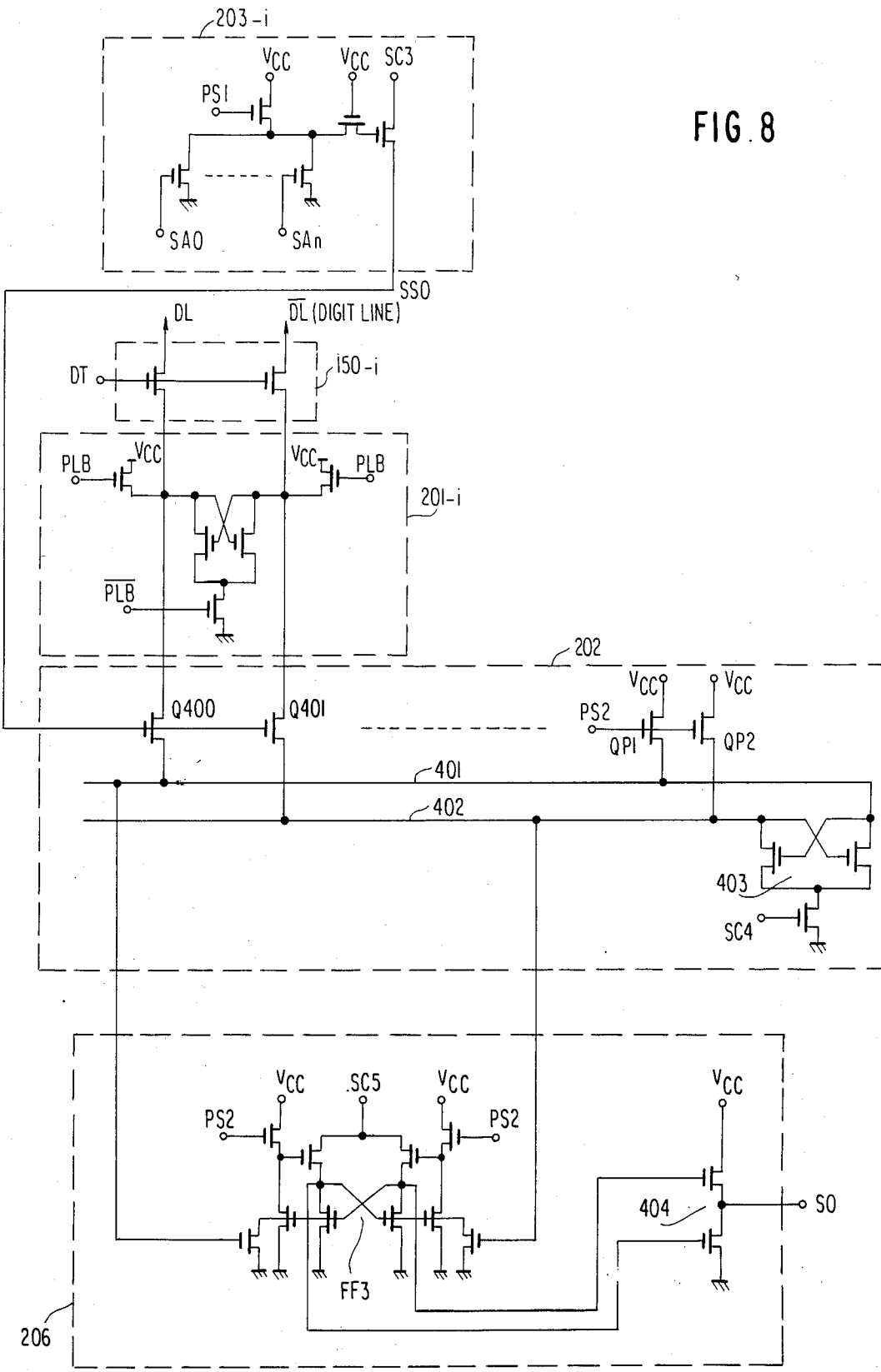
FIG. 8 shows detailed structures relating to the serial unit employed in the invention.

FIG. 8 illustrates the detailed structures of the register 201, decoder 203, bus line 202 and buffer 206. One stage 203-c of the decoder 203 has a known NOR structure and generates a decoding output SO in response to SC3 when all the inputs $SA_o$ ... $SA_n$ from the counter 204 are at a low level. A single stage 201-i of the register 201 is composed of a flip-flop, which is enabled by $\overline{PLB}$. The bus line circuit 202 comprises a pair of bus lines 401 and 402, a hold circuit 403, a pair of precharge FETs $Q_{p1}$ and $Q_{p2}$ for precharging the bus lines 401 and 402, and a plurality of pairs of selection FETs ($Q_{400}$ and $Q_{401}$ are representatively illustrated) controlled by the decoder output SO. The buffer 206 is basically composed of a flip-flop FF3, which is enabled by SC5 and a push-pull circuit 404.

As has been described above, serial data having a large flexibility can be attained independently of the RAM unit by optionally setting the start address of the serial unit by the use of the column address buffer of the RAM unit so that the performance as a video memory can be improved.

I claim:
1. A dual port memory comprising a memory cell array including memory cells arranged in rows and columns; a random access peripheral circuit for performing a random access operation with respect to said cell array in response to row and column address information; and a series access peripheral circuit performing consecutive access operations with respect to the columns of said array in response to shift pulses; said serial access circuit including a selection circuit for selecting one of said columns to be accessed, a counter circuit, means responsive to the output of said counter circuit for controlling said selection circuit, means for setting the counting value of said counter at an optional value and means for consecutively advancing the state of said counter circuit from said optional value in response to said shift pulses.

2. The memory according to claim 1, wherein said setting means includes a first transfer circuit for operatively applying the column address information to said counter circuit thereby to determine the state of said counter circuit.

3. The memory according to claim 1, further comprising a plurality of data store circuits, each of said data store circuits operatively storing data on the associated one of said columns.

4. The memory according to claim 3, further comprising a second transfer circuit coupled between said columns of said array and said data store circuits for operatively connecting the data on said columns to said data store circuits.

5. The memory according to claim 1, wherein said selection circuit includes a decoding circuit for decoding the state of said counter circuit.

6. The memory according to claim 1, wherein said setting means sets said counter circuit at the optional value during a period when said shift pulse is at an inactive level.

7. A dual port memory comprising: a memory array including a matrix of memory cells arranged at the intersections of word lines and digit lines; a random access circuit for effecting a write operation and a read operation randomly to and from said array in response to row address signals and column address signals; a data hold circuit including a plurality of storage units, a plurality of first transfer gates each coupled between an associated one of said digit lines and an associated one of said storage units; a counter circuit which increases its count value in response to shift pulses, a plurality of second transfer gates adapted to operatively supply said column address signal to said counter circuit; a selection circuit responsive to the output of said counter circuit for selectively outputting data stored in the storage unit defined by the count in said counter circuit, means for consecutively advancing the counting state of said counter circuit in response only to a train of said shift pulses; and means for operatively enabling said first and second transfer gates in response to a transfer control signal.

8. The memory according to claim 7, wherein said transfer control signal is energized during a period that said shift pulses are at an inactive level.

9. The memory according to claim 7, wherein each of said storage units includes a flip-flop.

10. The memory according to claim 7, wherein said random access circuit incorporates the row address signals and the column address signals in response to a row address strobe signal and a column strobe signal, respectively.

11. A dual port memory comprising a memory cell array including memory cells arranged in rows and columns; first means for receiving row address signals; second means for receiving column address signals; a random access peripheral circuit for performing a random access operation with respect to said cell array in response to said row and column address signals; and a serial access peripheral circuit performing consecutive access operations with respect to the columns of said array in response to shift pulses; said serial access circuit including a selection circuit for selecting one of said columns to be accessed, a serial addressing circuit for serially changing the selection state of said selection circuit, third means coupled to said second means for setting the output state of said serial addressing circuit at an arbitrary value in response to said column address signals, and fourth means for consecutively advancing the output state of said serial addressing circuit in response only to a train of said shift pulses.

12. The memory according to claim 11, wherein said third means includes a first transfer circuit for operatively applying the column address information to said counter circuit thereby to determine the state of said counter circuit.

13. The memory according to claim 11, further comprising a plurality of data store circuits, each of said data store circuits operatively storing data on the associated one of said columns.

14. The memory according to claim 13, further comprising a second transfer circuit coupled between said columns of said array and said data store circuits for operatively connecting the data on said columns to said data store circuits.

15. The memory according to claim 11, wherein said selection circuit includes a decoding circuit for decoding the state of said counter circuit.

16. The memory according to claim 11, wherein said third means sets said counter circuit at the optional value during a period when said shift pulse is at an inactive level.

* * * * *

UNITED STATES PATENT AND TRADEMARK OFFICE
CERTIFICATE OF CORRECTION

PATENT NO. : 4,633,441
DATED : December 30, 1986
INVENTOR(S) : Shoji Ishimoto

It is certified that error appears in the above-identified patent and that said Letters Patent is hereby corrected as shown below:

On the Title Page, Item [73] should read:

[73] Assignee: NEC Corporation
Japan

Signed and Sealed this

Seventh Day of April, 1987

Attest:

DONALD J. QUIGG

Attesting Officer     Commissioner of Patents and Trademarks

UNITED STATES PATENT AND TRADEMARK OFFICE
CERTIFICATE OF CORRECTION

PATENT NO. : 4,633,441

DATED : December 30, 1986

INVENTOR(S) : Shoji ISHIMOTO

It is certified that error appears in the above-identified patent and that said Letters Patent is hereby corrected as shown below:

Column 6, Line 51    Delete "series" insert -- serial --
Claim 1              page 16, line 6

Signed and Sealed this

Fifteenth Day of September, 1987

Attest:

DONALD J. QUIGG

Attesting Officer    Commissioner of Patents and Trademarks